(12) United States Patent
Reams

(10) Patent No.: US 8,009,054 B2
(45) Date of Patent: *Aug. 30, 2011

(54) SYSTEMS, METHODS AND APPARATUS FOR ADJUSTING A LOW BATTERY DETECTION THRESHOLD OF A REMOTE CONTROL

(75) Inventor: William R Reams, Englewood, CO (US)

(73) Assignee: EchoStar Technologies L.L.C., Englewood, CO (US)

( * ) Notice: Subject to any disclaimer, the term of this patent is extended or adjusted under 35 U.S.C. 154(b) by 480 days.

This patent is subject to a terminal disclaimer.

(21) Appl. No.: 12/104,291

(22) Filed: Apr. 16, 2008

(65) Prior Publication Data

US 2009/0262254 A1 Oct. 22, 2009

(51) Int. Cl.
*G08B 21/00* (2006.01)

(52) U.S. Cl. ........... 340/636.15; 340/636.1; 340/636.12; 340/636.13; 340/635; 340/691.1; 324/426; 324/433; 429/90; 429/92; 702/63; 702/64

(58) Field of Classification Search ............ 340/636.15, 340/636.1, 635, 691.1, 636.11–636.13; 324/76.11–157, 426, 433, 437; 320/116, 320/134, 136, 132, 148–152, 157, 159; 348/734, 348/E5.095; 702/63–65; 429/90–92
See application file for complete search history.

(56) References Cited

U.S. PATENT DOCUMENTS

| | | |
|---|---|---|
| 4,067,000 A | 1/1978 | Carlson |
| 4,231,026 A | 10/1980 | Sullivan |
| 4,578,671 A | 3/1986 | Flowers |
| 4,598,243 A | 7/1986 | Kawakami |
| 5,115,236 A | 5/1992 | Koehler |
| 5,164,652 A | 11/1992 | Johnson |
| 5,204,657 A | 4/1993 | Prosser |
| 5,294,915 A | 3/1994 | Owen |
| 5,455,560 A | 10/1995 | Owen |

(Continued)

FOREIGN PATENT DOCUMENTS

EP 1435563 7/2004

(Continued)

OTHER PUBLICATIONS

International Search Report for PCT application PCT/US2009/039948, mailed on Jul. 2, 2009.

(Continued)

*Primary Examiner* — George A Bugg
*Assistant Examiner* — Sisay Yacob
(74) *Attorney, Agent, or Firm* — Max S Gratton

(57) ABSTRACT

Various embodiments of systems, methods and apparatus are provided for adjusting a low battery detection threshold in a remote control. An embodiment of a method includes determining a type of a battery powering a remote control of an entertainment device and determining a first low battery threshold for the battery based on the type of the battery. The first low battery threshold indicates a low battery condition of the remote control. Responsive to measuring a voltage of the battery, a determination is made regarding whether the voltage of the battery is below the low battery threshold. Responsive to determining that the voltage of the battery is below the first low battery threshold, a low battery message is transmitted to an entertainment device. The entertainment device utilizes the message to present an indicator to a user regarding the low battery condition of the remote control.

15 Claims, 6 Drawing Sheets

U.S. PATENT DOCUMENTS

| | | |
|---|---|---|
| 5,506,572 A | 4/1996 | Hills |
| 5,519,760 A | 5/1996 | Borkowski et al. |
| 5,583,491 A | 12/1996 | Kim |
| 5,598,143 A | 1/1997 | Went |
| 5,638,050 A | 6/1997 | Sacca |
| 5,684,471 A | 11/1997 | Bernardi et al. |
| 5,705,997 A | 1/1998 | Park |
| 5,926,090 A | 7/1999 | Taylor |
| 5,945,918 A | 8/1999 | McGonigal |
| 5,963,010 A | 10/1999 | Hayashi |
| 5,990,868 A | 11/1999 | Frederick |
| 5,999,799 A | 12/1999 | Hu |
| 6,002,450 A | 12/1999 | Darbee et al. |
| 6,191,551 B1 | 2/2001 | Fischer |
| 6,230,277 B1 | 5/2001 | Nakaoka et al. |
| 6,295,002 B1 | 9/2001 | Fukuda |
| 6,373,256 B1 | 4/2002 | Hanjani |
| 6,407,779 B1 | 6/2002 | Herz |
| 6,449,726 B1 | 9/2002 | Smith |
| 6,535,125 B2 | 3/2003 | Trivett |
| 6,573,832 B1 | 6/2003 | Fugere-Ramirez |
| 6,633,281 B2 | 10/2003 | Lin et al. |
| 6,664,744 B2 | 12/2003 | Dietz |
| 6,725,064 B1 | 4/2004 | Wakamatsu |
| 6,771,182 B1 | 8/2004 | Loh et al. |
| 6,791,467 B1 | 9/2004 | Ben-Ze'ev |
| 6,938,101 B2 | 8/2005 | Hayes |
| 6,985,069 B2 | 1/2006 | Marmaropoulos |
| 7,009,528 B2 | 3/2006 | Griep |
| 7,047,333 B2 | 5/2006 | Leung et al. |
| 7,362,227 B2 | 4/2008 | Kim |
| 7,474,248 B2 | 1/2009 | Nakamura et al. |
| 7,738,792 B2 | 6/2010 | Flachs et al. |
| 7,757,105 B2 | 7/2010 | Okazaki |
| 7,852,255 B2 | 12/2010 | Rapisarda |
| 7,907,060 B2 | 3/2011 | Reams |
| 2002/0085128 A1 | 7/2002 | Stefanik |
| 2002/0093481 A1 | 7/2002 | Kehlstadt |
| 2003/0026424 A1 | 2/2003 | McGarrahan et al. |
| 2003/0035074 A1 | 2/2003 | Dubil |
| 2003/0159146 A1 | 8/2003 | Kim |
| 2004/0096051 A1 | 5/2004 | Kim et al. |
| 2004/0148632 A1 | 7/2004 | Park |
| 2004/0161031 A1 | 8/2004 | Kwentus et al. |
| 2004/0203374 A1 | 10/2004 | Zilliacus |
| 2004/0235446 A1* | 11/2004 | Flaherty et al. ............... 455/352 |
| 2004/0250273 A1 | 12/2004 | Swix et al. |
| 2004/0252247 A1 | 12/2004 | Wabiszczewicz |
| 2005/0033887 A1 | 2/2005 | Kim et al. |
| 2005/0146438 A1 | 7/2005 | Giger et al. |
| 2006/0017581 A1 | 1/2006 | Schwendinger et al. |
| 2006/0034611 A1 | 2/2006 | Li |
| 2006/0081771 A1 | 4/2006 | Eliad |
| 2007/0018845 A1 | 1/2007 | Sutardja |
| 2007/0080823 A1 | 4/2007 | Fu et al. |
| 2007/0130609 A1 | 6/2007 | Han et al. |
| 2007/0185968 A1 | 8/2007 | White et al. |
| 2007/0279332 A1 | 12/2007 | Fryer et al. |
| 2008/0040758 A1 | 2/2008 | Beetcher et al. |
| 2008/0098426 A1 | 4/2008 | Candelore |
| 2008/0163049 A1 | 7/2008 | Krampf |
| 2008/0267435 A1 | 10/2008 | Schumaier |
| 2008/0312852 A1* | 12/2008 | Maack ............................ 702/63 |
| 2009/0002218 A1 | 1/2009 | Rigazio et al. |
| 2009/0122206 A1 | 5/2009 | Jung |
| 2009/0174653 A1 | 7/2009 | Shin et al. |
| 2009/0241052 A1 | 9/2009 | Ha et al. |
| 2009/0243909 A1 | 10/2009 | Reams |
| 2009/0249086 A1 | 10/2009 | Reams |
| 2009/0262254 A1 | 10/2009 | Reams |
| 2009/0278701 A1 | 11/2009 | Reams |
| 2009/0303097 A1 | 12/2009 | Reams |
| 2009/0328232 A1 | 12/2009 | Reams |

FOREIGN PATENT DOCUMENTS

| | | |
|---|---|---|
| EP | 1884869 | 2/2008 |
| GB | 2331610 | 5/1999 |
| GB | 2347592 | 9/2000 |
| GB | 2398138 | 8/2004 |
| JP | 01 114298 A | 5/1989 |
| JP | 04148499 | 5/1992 |
| JP | 10334380 | 12/1998 |
| JP | 00130848 | 5/2000 |
| JP | 2004 092946 A | 3/2004 |
| JP | 06020386 | 1/2006 |
| WO | WO 2007/023437 | 3/2007 |
| WO | WO 2007/086633 | 8/2007 |
| WO | WO 2008/146095 | 12/2008 |

OTHER PUBLICATIONS

International Search Report dated Jul. 20, 2009, PCT/US2009/037856, 2 pages.
International Search Report dated Jun. 24, 2009, PCT/US2009/037871, 4 pages.
International Search Report dated Jul. 8, 2009, PCT/US2009/042651, 5 pages.
International Search Report dated Aug. 27, 2009, PST/US2009/044302, 3 pages.
International Search Report dated May 26, 2010, PCT/US2010/026694, 4 pages.
Osoinach, Bryce, "Proximity Capacitive Sensor Technology for Touch Sensing Applications," Proximity Sensing White Paper prepared for Freescale Semiconductor, Inc., Tempe, Arizona, 2007, 12 pages.
Office Action dated Oct. 8, 2010, U.S. Appl. No. 12/056,520, 11 pages.
Amendment and Response to Office Action dated Jan. 10, 2011, U.S. Appl. No. 12/056,520, 8 pages.
Office Action dated Jan. 27, 2011, U.S. Appl. No. 12/056,620, 11 pages.
Office Action dated Jun. 25, 2010, U.S. Appl. No. 12/177,628, 20 pages.
Amendment and Response to Office Action dated Oct. 25, 2010, U.S. Appl. No. 12/177,628, 20 pages.
Notice of Allowance and Fee(s) Due dated Jan. 6, 2011, U.S. Appl. No. 12/177,628, 12 pages.
Office Action dated Feb. 14, 2011, U.S. Appl. No. 12/135,370, 22 pages.
Office Action dated Mar. 3, 2011, U.S. Appl. No. 12/404,848, 11 pages.

* cited by examiner

SYSTEMS, METHODS AND APPARATUS FOR ADJUSTING A LOW BATTERY DETECTION THRESHOLD OF A REMOTE CONTROL

BACKGROUND

Many remote controls for entertainment devices include a feature that detects a low battery condition and alerts the user of the low battery condition. For example, a remote control for a satellite television receiver may detect that the battery powering the remote control only has 10% of its usable life left. The remote control may communicate the low battery condition to the satellite television receiver, and the receiver may present an indicator to a user regarding the low battery condition. Thus, the user may take action to replace the batteries to avoid experiencing a subsequent dead battery in the remote control.

The low battery conditions typically detected based on comparing a terminal voltage of the battery with a low battery threshold voltage. The usable life of the battery is directly correlated with a terminal voltage of the battery. A specified point on a voltage discharge curve indicates a remaining usable life of the battery. However, there are many different types of batteries, and each type of battery does not follow the same voltage discharge curve. For example, a terminal voltage of ~1.20 V may correspond to 10% of the remaining usable life of a nickel metal hydride (NiMH) battery, whereas a terminal voltage of ~1.05 V may correspond with the same remaining usable life of an alkaline battery. Because the batteries of a remote control may be replaced with either type of battery, the utilization of a single threshold value indicating a low battery condition often results in providing a user with little warning regarding dead batteries or prompting the user to replace the batteries more often than necessary. Thus, the user may become dissatisfied with the battery replacement indicators provided by the satellite television receiver.

BRIEF DESCRIPTION OF THE DRAWINGS

The same number represents the same element or same type of element in all drawings.

DETAILED DESCRIPTION

The various embodiments described herein generally provide apparatus, systems and methods for indicating to a user a low battery condition of a remote control for an entertainment device. More particularly, the various embodiments described herein generally provide apparatus, systems and methods which facilitate determining an appropriate voltage threshold utilized to determine/define a low battery condition of the remote control based on a type of the battery utilized in the remote control. In short, the various embodiments described provide apparatus, systems and/or methods for adjusting a low battery threshold based on a type of battery utilized in a remote control.

Figure 1:
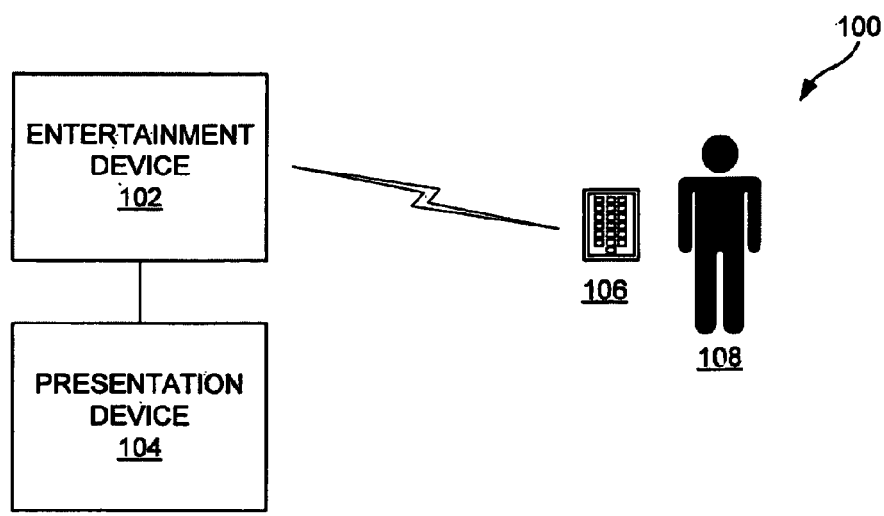
FIG. 1 illustrates an embodiment of an entertainment system.

FIG. 1 illustrates an embodiment of an entertainment system 100. The entertainment system 100 presents content to a user 108. In at least one embodiment, the content presented to the user 108 includes an audio/video stream, such as a television program, movie or other recorded content and the like. The entertainment system 100 includes an entertainment device 102, a presentation device 104 and a remote control 106. Each of these components is discussed in greater detail below. The entertainment system 100 may include other devices, components or elements not illustrated for the sake of brevity.

The entertainment device 102 is operable to receive content from one or more content sources (not shown in FIG. 1), and to present the received content to the user 108 on the associated presentation device 104. In at least one embodiment, the presentation device 104 is a display device (e.g., a television) configured to display content to the user 108. The entertainment device 102 may receive an audio/video stream in any format (e.g., analog or digital format), and output the audio/video stream for presentation by the presentation device 104. The entertainment device 102 may be further configured to display menus and other information that allow a user 108 to control the output of content by the entertainment device 102. In at least one embodiment, the entertainment device 102 is a set top box (e.g., a satellite or cable television converter box), digital video recorder (DVR) or other similar device that processes and provides one or more audio and/or video output streams to the presentation device 104 for presentation to the user 108. In some embodiments, the entertainment device 102 and the presentation device 104 may be integrated as a device combining the functionality of a display device and a set-top box, digital video recorder (DVR) or the like.

The remote control 106 may comprise any system or apparatus configured to remotely control the output of content by the entertainment device 102. For example, the remote control 106 may communicate commands to the entertainment device 102 requesting to playback content, temporally move through content (e.g., fast-forward or reverse), adjust the volume, access electronic programming guides and the like. In some embodiments, the remote control 106 may additionally be configured to remotely control the presentation device 104. The remote control 106 may communicate with the entertainment device 102 and/or the presentation device 104 through any type of wireless communication medium, such as infrared (IR) signals or radio-frequency (RF) signals.

The remote control 106 is powered by one or more removable batteries. The terms "battery" and "batteries," will be used interchangeably herein. It is to be appreciated that the techniques described herein may be applied to remote controls powered by a single removable battery or multiple removable batteries. The removable batteries may be any type of battery, such as AA batteries or AAA batteries typically used to power consumer electronic devices, such as remote controls. Further, the removable batteries may comprise any type of battery typically used to power consumer electronic devices, such as alkaline batteries, nickel metal hydride (NiMH) batteries, nickel cadmium (NiCad) batteries or Lithium Ion batteries. The remote control 106 is configured to detect a low battery condition when the batteries have a specified usable life remaining, such that the entertainment system 100 may indicate the low battery condition to the user 108. Thus, the user 108 may replace the batteries powering the remote control 106 to avoid future interruptions to their viewing experience caused by dead batteries in the remote control 106.

For example, the entertainment system 100 may indicate to the user 108 when the remaining usable life of the batteries in the remote control 106 reaches 10% (e.g., a low battery condition). In at least one embodiment, the remote control 106 detects the existence of the low battery condition and transmits a low battery message to the entertainment device 102 regarding the low battery condition. Thus, the entertainment device 102 may include a message in the presentation stream output to the presentation device 104 responsive to the low battery message. For example, if the presentation stream is an audio/video stream, then the entertainment device 102 may insert a warning message or other type of indicator into the audio/video stream for display by the presentation device 104. The entertainment device 102 may also indicate the low battery condition using a low battery indicator (e.g., an LED) on the exterior of the entertainment device 102.

In other embodiments, the remote control 106 may include an integrated presentation device, such as a display screen or speaker that is capable of presenting information to the user 108. Thus, the remote control 106 may be configured to communicate an indicator to the user 108 regarding the low battery condition without cooperative operation with the entertainment device 102. For example, the remote control 106 may present an indicator to the user 106 on an integrated display screen of the remote control 106 regarding the low battery message.

In at least one embodiment, the remote control 106 detects the low battery condition by measuring the voltage of the batteries powering the remote control and comparing the voltage against a pre-defined threshold. As described above, the user 108 may replace the batteries in the remote control with any type of appropriate battery, including alkaline batteries, NiMH batteries or NiCad batteries. Thus, if the remote control 106 utilizes a single low battery threshold to detect the existence of the low battery condition, then the entertainment system 100 may provide the user 108 with little warning regarding dead batteries or may prompt the user 108 to replace the batteries more often than necessary.

To avoid this problem, the remote control 106 is configured to determine the type of battery powering the remote control 106 and adjust the threshold utilized to detect the low battery condition accordingly. For example, the remote control 106 may be configured to differentiate between alkaline batteries, NiMH batteries or NiCad batteries. The remote control 106 may detect the type of battery (e.g., the battery chemistry) utilizing any appropriate detection technique. In at least one embodiment, the remote control 106 detects the battery type by measuring the initial voltage of the replacement batteries in the remote control 106. The voltage measurement detection technique is described in greater detail below.

In other embodiments, the remote control 106 includes a switch having multiple positions, with each position of the switch corresponding with a particular battery type (e.g., alkaline, NiMH or NiCad). For example, the switch may be disposed within the battery compartment of the remote control 106. Upon replacing the batteries in the remote control 106, the user 108 selects the appropriate position of the switch to designate the type of the battery that is powering the remote control 106. The remote control 106 thus may responsively adjust the threshold utilized to identify a low battery condition based upon the position of the switch. In another embodiment, the remote control 106 and the entertainment device 102 cooperatively operate to solicit user input from the user 108 identifying the type of the replacement batteries in the remote control responsive to the user 108 replacing the batteries. The solicitation of user input is described in greater detail below.

After identifying the type of batteries utilized in the remote control 106, the remote control 106 selects an appropriate threshold for identifying a low battery condition. The remote control 106 may then utilize the threshold to monitor for a low battery condition. In at least one embodiment, the remote control 106 monitors for a low battery condition while processing each user input entered by the user 108. In other words, as components of the remote control 106 draw power from the battery, the remote control 106 monitors the batteries to determine whether the terminal voltage is below the: low battery threshold. If the terminal voltage is below the low battery threshold, then a low battery condition within the remote control 106 may exist.

Figure 2:
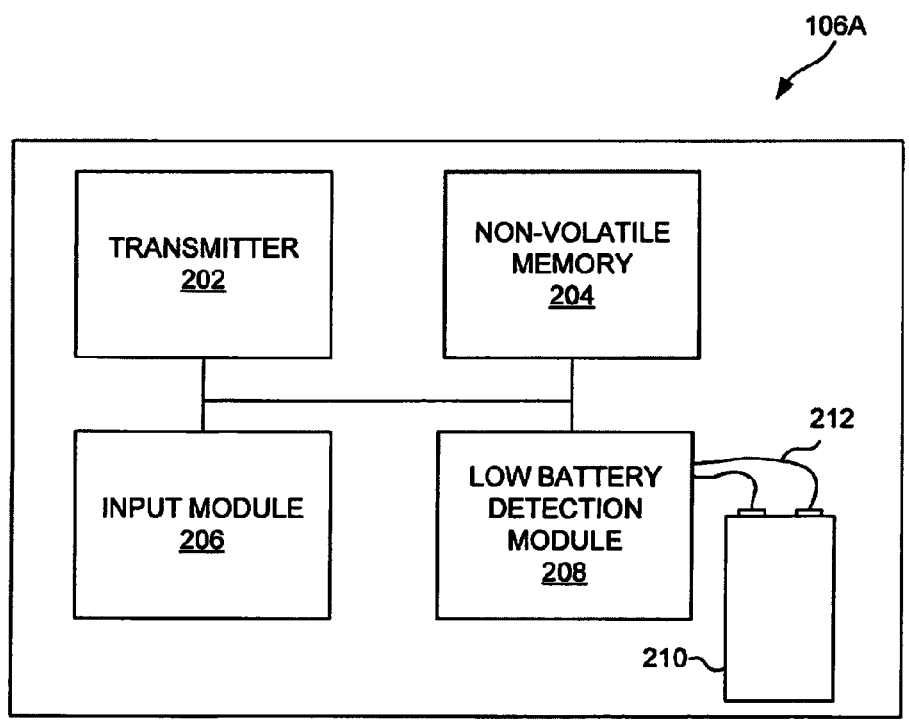
FIG. 2 illustrates an embodiment of a remote control of the entertainment system of FIG. 1.

FIG. 2 illustrates an embodiment of a remote control 106A of the entertainment system 100 of FIG. 1. FIG. 2 will be discussed in reference to the entertainment system 100 illustrated in FIG. 1. The remote control 106A includes a transmitter 202, a non-volatile memory 204, an input module 206, a low battery detection module 208, a battery 210 and a battery connector 212. Each of these components is discussed in greater detail below. The remote control may contain other devices, such as pointing devices (e.g., touchpads), not mentioned herein for brevity.

The input module 206 is operable for receiving user input from the user 108 (see FIG. 1). In at least one embodiment the input module 206 is a keypad including a set of buttons. A user may utilize the keypad to input channel numbers control the volume of the entertainment device 102 (see FIG. 1), navigate menus, manipulate the output of content by the entertainment device 102 and/or control other functions of the entertainment device 102 and/or the presentation device 104. The input module 206 further includes a processor operable to generate control commands for the entertainment device 102 (see FIG. 1) responsive to the user input. The control commands may be in the form of key codes that are compatible with the entertainment device 102 (see FIG. 1).

The transmitter 202 is operable for wirelessly communicating with the entertainment device 102 (see FIG. 1) and/or the presentation device 104. More particularly, the transmitter 202 is operable for transmitting a key code and/or command message corresponding with user input to the entertainment device 102 (see FIG. 1). The transmitter 202 may utilize any type of wireless protocol and wireless communication medium, including RF or IR key codes, to communicate with the entertainment device 102 (see FIG. 1) and/or the presentation device 104. In at least one embodiment, the transmitter 202 is a transceiver that bi-directionally communicates with the entertainment device 102. For example, the remote control 106A may receive IR database or firmware updates from the entertainment device 102A.

The remote control 106A further includes a battery connector 212 that connects to a battery 210 powering the remote control 106A. The battery connector 212 may comprise any type of connector that connects to the battery 210 to draw power for supplying other components of the remote control 106A. For example, the battery connector 212 may include two opposing connections for connecting to the terminals of an AA or AAA battery. In at least one embodiment, the battery connector 212 is configured to connect to multiple batteries, such as 2 or 4 AAA batteries.

The low battery detection module 208 is operable to detect low battery conditions of the remote control 106A. More particularly, the low battery detection module 208 is operable to determine whether terminal voltage of the battery 210 drops below a threshold value, indicating a low battery condition. The low battery detection module 208 is capable of utilizing multiple threshold values for indicating a low battery condition, depending on the type of battery 210 utilized in the remote control 106A.

After the battery 210 is replaced in the remote control 106A, the low battery detection module 208 determines a type of the battery 210 connected to the battery connector 212. In at least one embodiment, the low battery detection module 208 measures the initial terminal voltage or impedance of the battery 210 to determine the type of the battery 210. For example, an initial voltage of ~1.50 V for a single battery 210 may indicate an alkaline type battery 210. By contrast an initial voltage of ~1.40 V for a single battery 210 may indicate a NiMH type battery 210. The low battery detection module 208 may include an analog-to-digital converter utilized to perform measurement functions for determining the type of the battery 210 powering the remote control 106A.

Responsive to determining the type of the battery 210, the low battery detection module 208 selects an appropriate low battery threshold value corresponding to the type of the battery 210. In at least one embodiment, the remote control 106A may store a table of threshold values, such as in the non-volatile memory 204, that correspond to various types of batteries useable by the remote control 106A. The threshold value may be selected to provide adequate warning to a user regarding a low battery condition.

Figure 3:
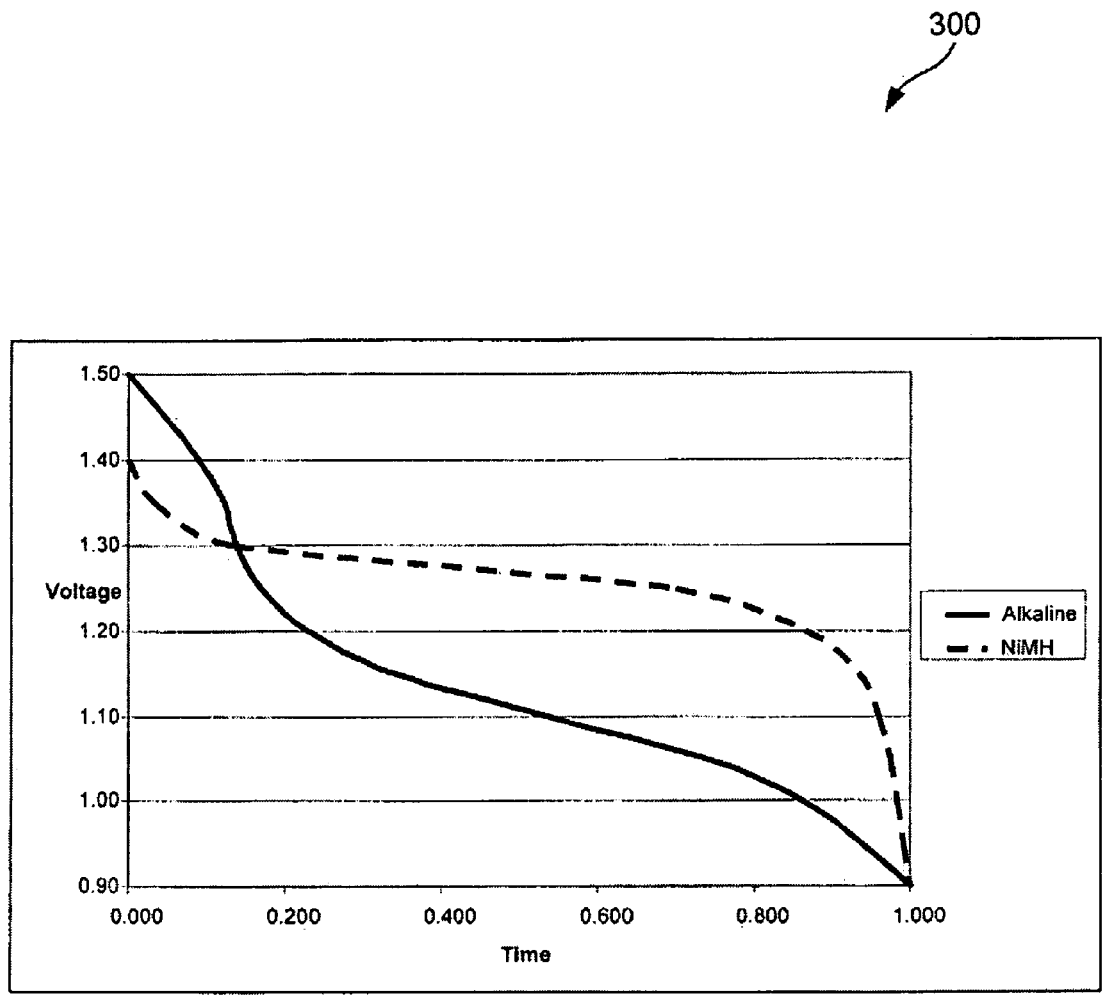
FIG. 3 illustrates an embodiment of a graph of the relationship between terminal voltage and time for alkaline and NiMH batteries.

FIG. 3 illustrates an embodiment of a graph 300 of the normalized relationship between terminal voltage and time for alkaline and NiMH batteries. In at least one embodiment, the threshold value may be selected to indicate to the user 108. when the battery 210 has set percentage of its usable life remaining. For example, 10% of remaining battery life corresponds with ~1.05 V for an alkaline battery and ~1.15 V for a NiMH battery. In at least one embodiment, responsive to detecting the low battery condition, the low battery detection module 208 transmits a message (via the transmitter 202) to the entertainment device 102 (see FIG. 1). The entertainment device 102 then outputs an indicator for presentation by the presentation device 104. In at least one embodiment, the low battery message may be transmitted to the entertainment device 102 appended to a control command. However, the low battery message may also be transmitted to the entertainment device 102 in a separate transmission.

If the terminal voltage of the battery 210 drops too low, then it may be unsafe for the remote control 106A to perform certain operations. For example, the remote control 106A may not be able to write data to the non-volatile memory 204 if the terminal voltage of the battery 210 is too low. Thus, in at least one embodiment, the low battery detection module 208 is adapted to compare the terminal voltage of the battery 210 with multiple threshold values. A first threshold value indicates when to warn the user 108 about the low battery threshold condition and a second threshold value indicates when the remote control 106A should refrain from performing certain functions, eg., writing to memory. In at least one embodiment the first threshold value is greater than the second threshold value. Thus, the user 108 is alerted about the low battery condition before the voltage of the battery 210 drops too low to perform certain functions of the remote control 106A.

Figure 4:
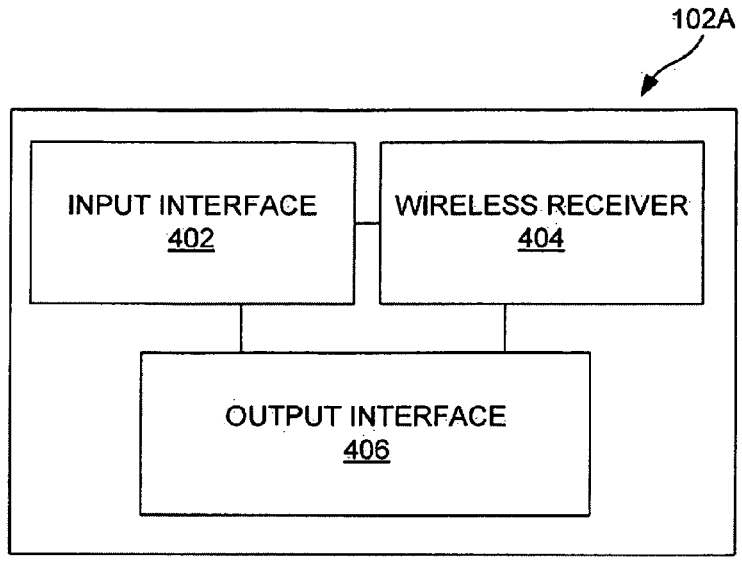
FIG. 4 illustrates an embodiment of an entertainment device of FIG. 1.

FIG. 4 illustrates an embodiment of an entertainment device 102A of FIG. 1. More particularly, FIG. 4 illustrates an entertainment device 102A embodied as a television receiver (e.g., a set-top box). However, it is to be appreciated that the entertainment device 102A may comprise any type of device that presents any type of presentation content. FIG. 4 will be discussed in reference to the entertainment system 100 illustrated in FIG. 1. The entertainment device 102A includes an input interface 402, a wireless receiver 404 and an output interface 406. Each of these components will be discussed in greater detail below. The entertainment device 102A may include other components or devices not illustrated for the sake of brevity.

The input interface 402 is operable for receiving presentation content, e.g., video content. The input interface 402 may be operable for receiving and tuning any type of video content. For example, the input interface 402 may receive an over-the-air broadcast signal, a direct broadcast satellite signal or a cable television signal. In at least one embodiment, the input interface 402 may receive or retrieve content from a storage medium, such as an optical disk, internal or external hard drives, portable storage devices (e.g., universal serial bus (USB) memory sticks) and the like. The input interface 402 may also receive content from external servers, such as video servers, that are communicatively coupled to the entertainment device 102A over the internet or other types of data networks.

The wireless receiver 404 is operable to wirelessly receive and/or transmit data to the remote control 106 (see FIG. 2). The wireless receive 404 may communicate with the remote control 106 utilizing any type of IR or RF communication link. In at least one embodiment, the wireless receiver 404 receives a key code from the remote control 106, and responsively provides the key code to the output interface 406. The wireless receiver 404 is further operable to receive other data from the remote control 106, such as low battery messages indicating a low battery condition it the remote control 106.

The output interface 406 is operable for controlling the operation of the entertainment device 102A. In at least one embodiment, the output interface 406 receives video content and responsively generates an output stream for presentation on a presentation device 104. The output interface 406 is further operable to receive a key code and manipulate the output of the video content responsive to the key code. In other words, the output interface 406 operates responsive to the key code to control an output stream of video content.

Figure 5:
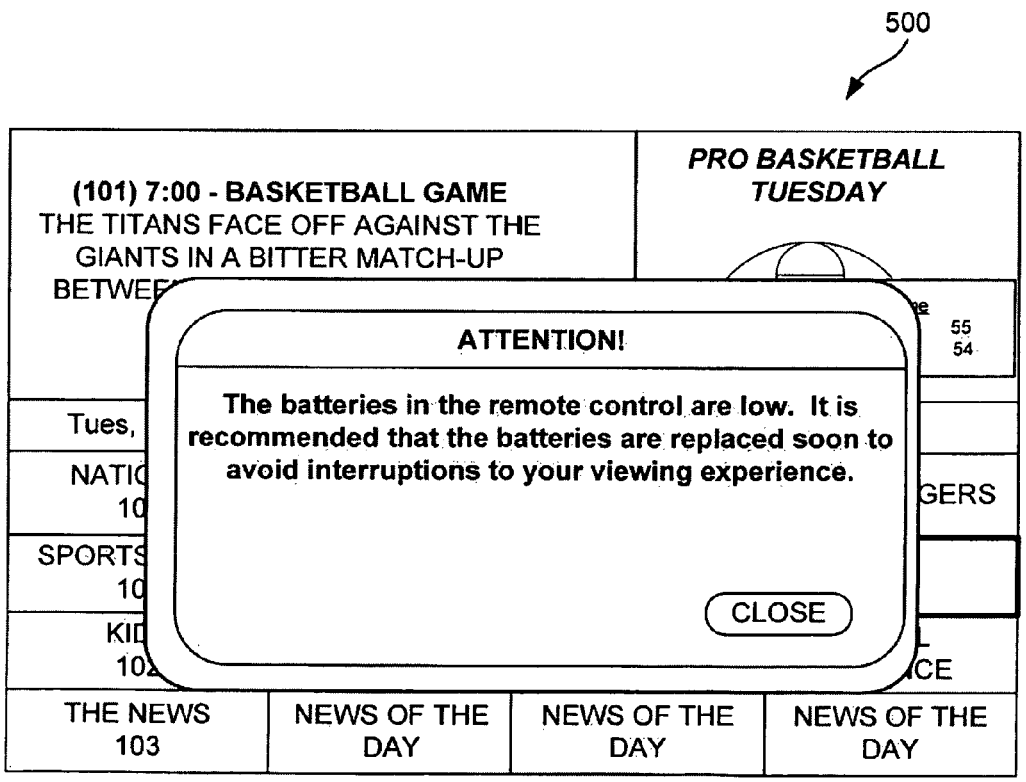
FIG. 5 illustrates an embodiment of a screenshot including a warning message regarding the low battery condition.

The output interface 406 is further operable to receive the low battery message and output an indicator to the user 108 regarding the low battery condition. For example, the output interface 406 may output a warning message in a video stream for presentation by the presentation device 104. FIG. 5 illustrates an embodiment of a screenshot 500 including a warning message regarding the low battery condition. The user 108 may take appropriate action responsive to the warning message to replace the batteries in the remote control to avoid disruptions to their viewing experience. Other indicators, such as audible indicators, blinking lights and the like may also be utilized by the entertainment device 102 to alert the user 108 regarding the low battery condition.

As described above, the entertainment, device 102A (see FIG. 4) may solicit information from the user 108 (see FIG. 1) regarding the type of the battery powering the remote control 106. For example, the remote control 106 may identify that the batteries in the remote control 106 have been replaced. A battery replacement message may be transmitted to the entertainment device 102A.

Figure 6:
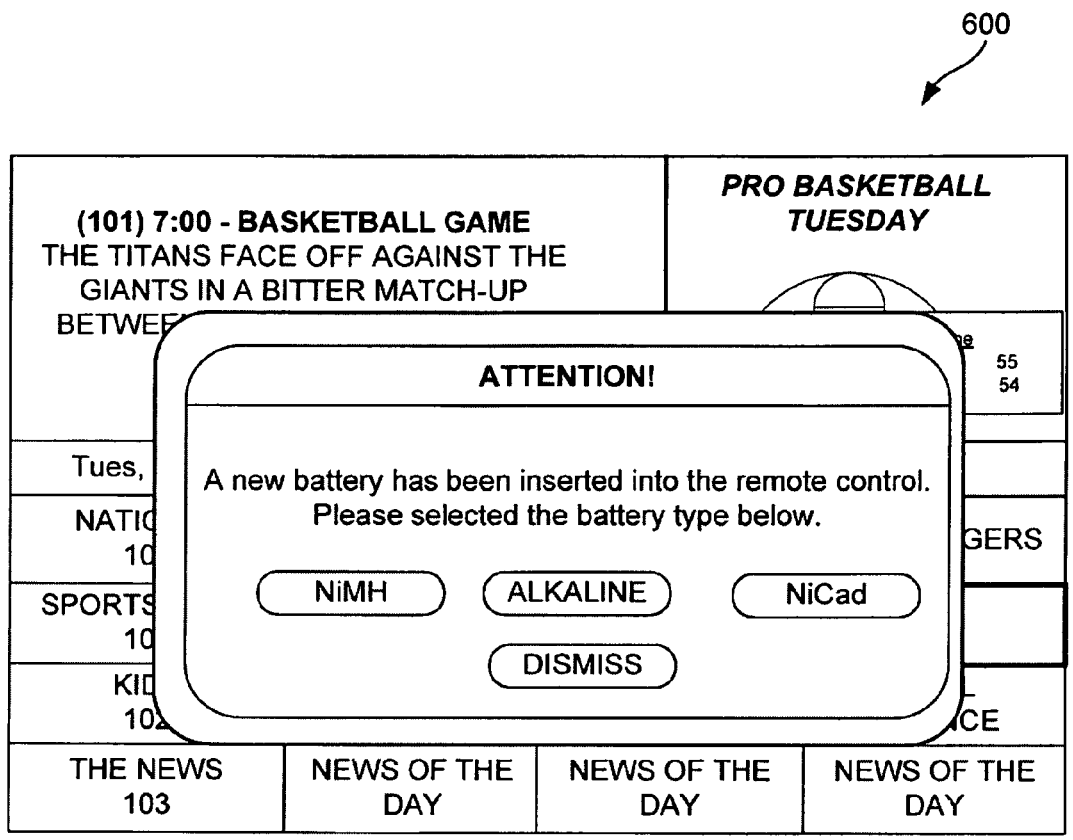
FIG. 6 illustrates an embodiment of a screenshot including a battery type selection menu.

Responsive to receiving the battery replacement message, the entertainment device 102A outputs a menu for presentation by the presentation device 104. FIG. 6 illustrates an embodiment of a screenshot 600 including a battery type selection menu. The presentation device 104 presents the screenshot 600 to the user 108. The user 108 then utilizes the remote control 106 to make a battery type selection from the menu in the screenshot 600. In at least one embodiment, the entertainment device 102A transmits a message to the remote control 106 indicating that the menu is presently being displayed by the presentation device 104. In other embodiments, the remote control 106 enters a user input solicitation state responsive to transmitting the battery replacement message to the entertainment device 102A to receive user input indicating the type of replacement battery in the remote control 106. The remote control 106 receives the user input from the user 108, and utilizes the user input to determine the type of battery powering the remote control 106. The remote control may then select an appropriate low battery threshold value based upon the type of battery powering the remote control 106.

Figure 7:
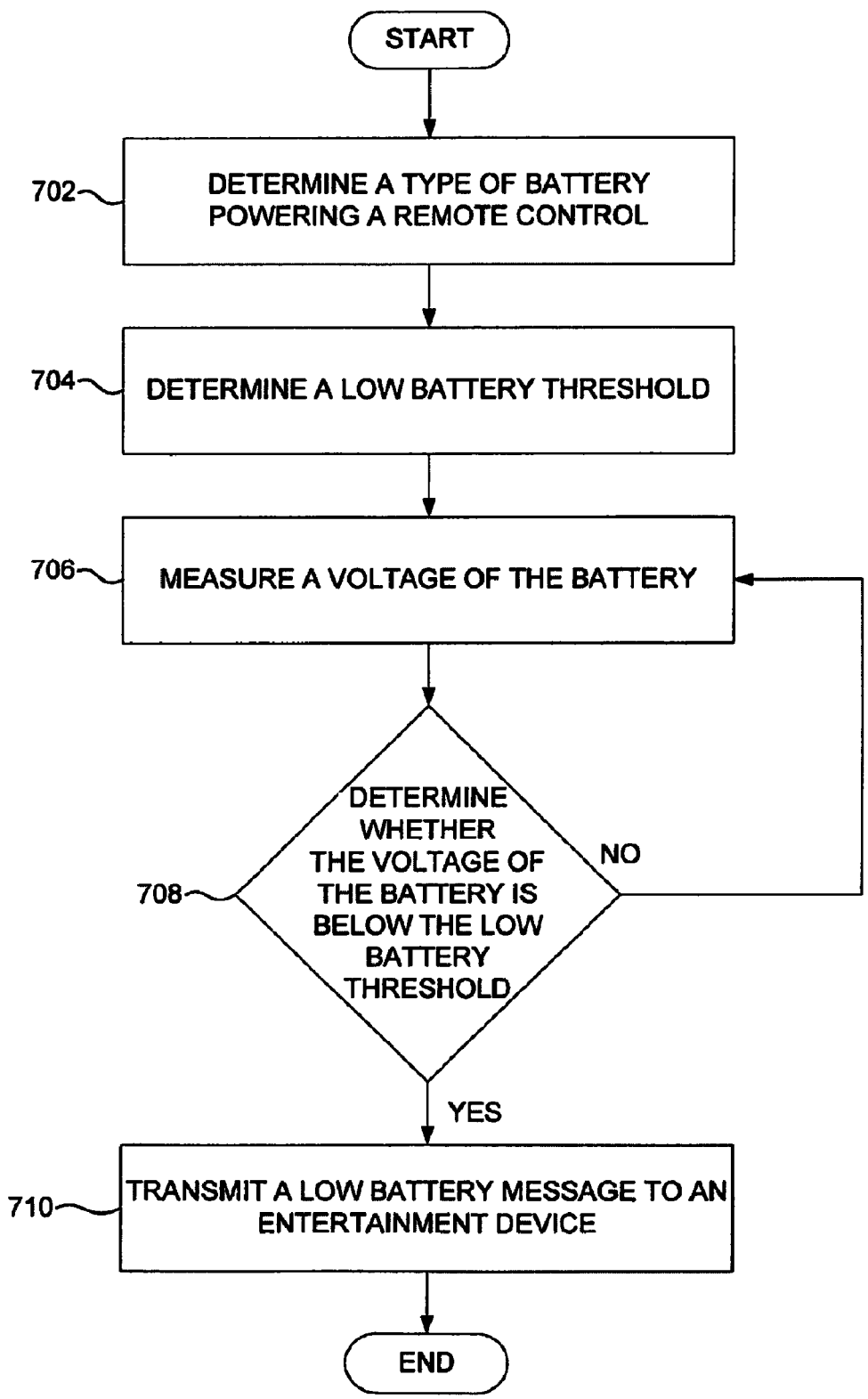
FIG. 7 illustrates an embodiment of a process for indicating a low battery condition in a remote control for an entertainment device.

FIG. 7 illustrates an embodiment of a process for indicating a low battery condition in a remote control for an entertainment device. The process of FIG. 7 will be discussed in reference to a television receiver. However, it is to be appreciated that the process may be applied to indicate low battery conditions in remote controls for other types of entertainment devices. The process of FIG. 7 is not all inclusive, and may include other operations not illustrated for the sake of brevity.

The process includes determining a type of battery powering a remote control for an entertainment device (operation 702). In at least one embodiment, the type of battery may be determined through detection circuitry of the remote control that detects the type of the battery by measuring an initial voltage of the battery. In other embodiments, user input may be utilized to determine the type of the battery. For example, the remote control may include a switch with selectable positions, each position corresponding with a particular type of battery powering the remote control. The remote control and the entertainment device may also solicit user input through one or more interfaces presented to the user by the entertainment device and/or other associated presentation devices.

The process further includes selecting a low battery threshold for the battery based on the type of the battery (operation 704). The low battery threshold indicates allow battery condition of the remote control. In at least one embodiment, the remote control determines the low battery threshold by selecting a value from a stored table that corresponds with the battery type. In other embodiments, the remote control may query the entertainment device for the low battery threshold responsive to determining the type of the battery powering the remote control.

The process further includes measuring a voltage of the battery (operation 706). The voltage measurement may be performed by circuitry of the remote control, such as a processor and/or an analog-to-digital converter. In at least one embodiment, the remote control measures the voltage of the battery during processing of user input received via a keypad or other input device or during transmission/reception of data to the entertainment device.

The process further includes determining whether the voltage of the battery is below the low battery threshold (operation 708). If the voltage is below the low battery threshold, then processing continues at step 710. Otherwise, processing returns to 706 to complete another measurement operation during processing of subsequent user input or transmission of data. The determination operation may be performed by any type of processor and/or comparison circuitry of the remote control.

In operation 710, the remote control transmits a low battery message to the entertainment device responsive to determining that the voltage of the battery is below the low battery threshold. The entertainment device utilizes the low battery message to present an indicator to a user regarding the low battery condition of the remote control. For example, a television receiver may output a warning message prompting the user to replace the batteries in the remote control. In at least one embodiment, the remote control presents an indicator to a user on a display screen or other presentation device integrated with the remote control rather than transmitting a low battery message to the television receiver. Through the operation of the process of FIG. 7, a user is alerted to the existence of a low battery condition and is prompted to replace the batteries of the remote control.

Figure 8:
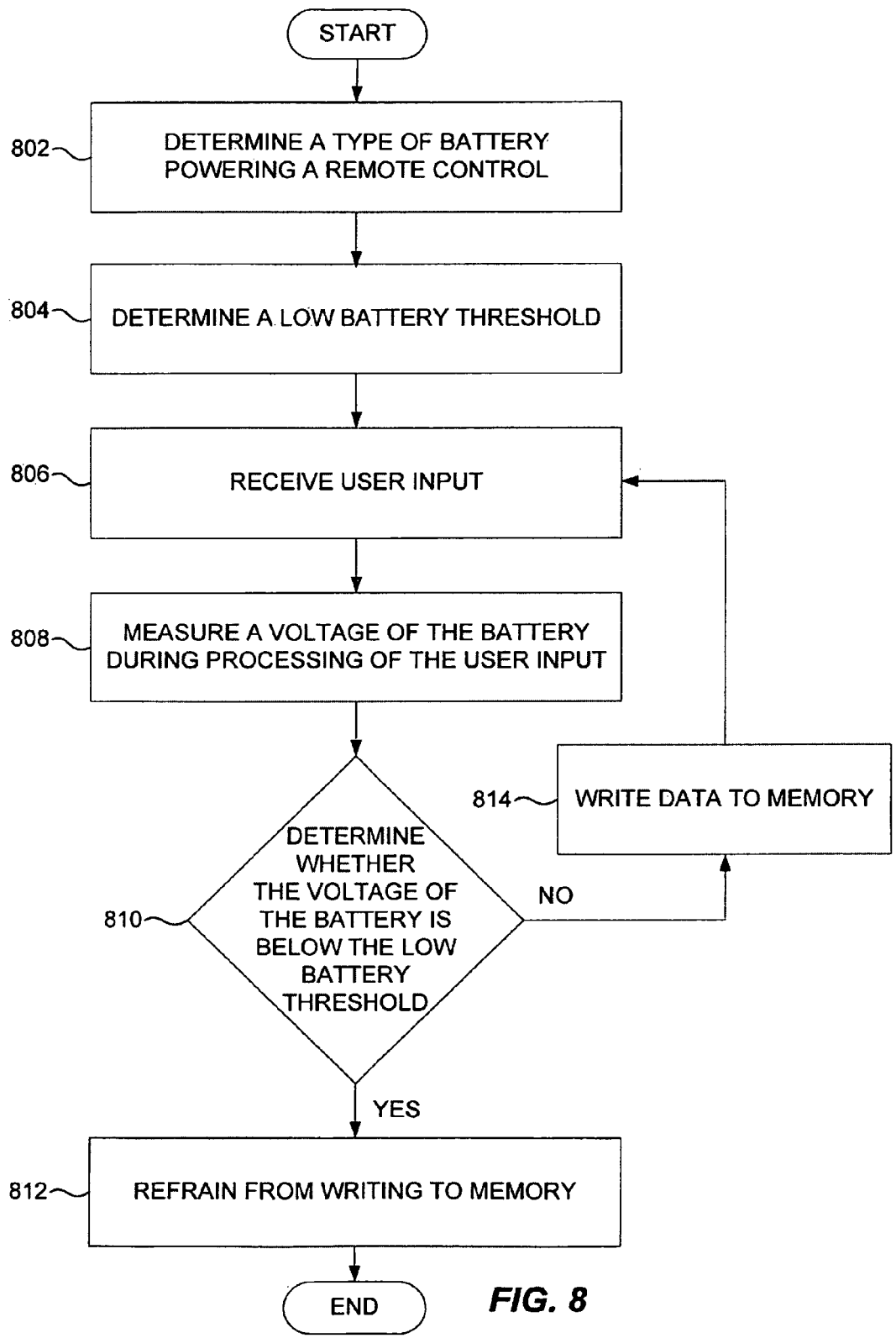
FIG. 8 illustrates an embodiment of a process for adjusting a voltage threshold indicating an unsafe operating condition of a remote control based on a battery type.

The adjustment of the low battery threshold based on a type of battery utilized in a remote control may also be utilized to restrict the remote control from performing certain functions if the terminal voltage of the battery drops too low for safe operation. FIG. 8 illustrates an embodiment of a process for adjusting a voltage threshold indicating an unsafe operating condition of a remote control based on a battery type. The process of FIG. 8 will be discussed in regard to writing to a non-volatile memory of the remote control. However, it is to be appreciated that the process may be applied to restrict any operation performed by a remote control that may be unsafe if the voltage of the batteries is too low. The process of FIG. 8 is not all inclusive, and may include other operations not illustrated for the sake of brevity.

The process includes determining a type of battery powering a remote control (operation 802). Operation 802 may be performed similarly to operation 702 of FIG. 7. The process further includes determining a low battery threshold indicating when the remote control is to refrain from performing a specified function (e.g., writing to non-volatile memory) (operation 804). Operation 804 may be performed similarly to operation 704 of FIG. 7. In at least one embodiment, the threshold value indicating when the remote control is to refrain from writing to memory maybe lower than the threshold value used to alert a user regarding a low battery condition of the remote control.

The process further includes receiving user input (operation 806). The user input may be received from a user via a keypad, touch screen or other similar input device of the remote control. In at least one embodiment, processing of the user input involves the remote control writing data to non-volatile memory. However, it may be unsafe for the remote control to write to non-volatile memory if the voltage of the battery is below the low battery threshold.

The process further includes measuring a voltage of the battery during processing of the user input (operation 808). Operation 808 may be performed similarly to operation 706 of FIG. 7. The voltage of the battery may also be measured during the performance of other actions of the remote control, such as receiving data from an entertainment device. For example the remote control may receive data from the entertainment device that is transmitted without user action or knowledge. The process further includes determining whether the voltage of the battery is below the low battery threshold (operation 810). Operation 810 may be performed similarly to operation 708 of FIG. 7.

If the voltage of the battery is below the low battery threshold, then processing continues in step 812, and the remote control processes the user input without writing to the non-volatile memory. In at least one embodiment, the remote control sends a "critically low battery" message to the entertainment device for presentation to a user. If the voltage of the battery is not below the low battery threshold, then the remote control processes the user input and writes data to memory (operation 814), and loops back to operation 806. Thus, another measurement may be performed responsive to the next user input processed by the remote control. Through the operation of the process of FIG. 8, the remote control minimizes the possibility of data corruption caused by writing to memory when the terminal voltage of the batteries is insufficient to support the write function.

Although specific embodiments were described herein, the scope of the invention is not limited to those specific embodiments. The scope of the invention is defined by the following claims and any equivalents therein.

I claim:

1. A remote control of an entertainment device comprising:
a battery connector that connects to a battery powering the remote control;
a low battery detection module, coupled to the battery connector, that measures an initial voltage of the battery when the battery is connected to the battery connector and compares the initial voltage of the battery to at least one battery type threshold voltage to determine a type of the battery connected to the battery connector, that determines a first low battery threshold voltage for the battery based on the type of the battery, the first low battery threshold voltage indicating a low battery condition of the remote control, and that measures a voltage of the battery to determine whether the voltage of the battery is below the first low battery threshold voltage; and
a transmitter coupled to the low battery detection module that transmits a low battery message to the entertainment device responsive to the low battery detection module determining that the voltage of the battery is below the first low battery threshold voltage, wherein the entertainment device utilizes the low battery message to present an indicator to a user regarding the low battery condition; and
an input module that receives user input, wherein processing of the user input involves the input module performing a specified function;
the low battery detection module determining a second low battery threshold voltage, the second low battery threshold voltage indicating when the input module is to refrain from performing the specified function, and further determining whether the voltage of the battery is below the second low battery threshold voltage; and
the input module refraining from performing the specified function during processing of the user input responsive to the low battery detection module determining that the voltage of the battery is below the second low battery threshold voltage;
wherein the specified function comprises writing to a non-volatile memory of the remote control.

2. The remote control of claim 1, further comprising:
a receiver that receives data from the entertainment device;
an input module that receives a user input, wherein processing of the user input involves the input module performing a specified function;
the low battery detection module determining a second low battery threshold voltage, the second low battery threshold voltage indicating when the input module is to refrain from performing the specified function, and further determining whether the voltage of the battery is below the second low battery threshold voltage; and
the input module refraining from performing the specified function during processing of data received from the entertainment device responsive to the low battery detection module determining that the voltage of the battery is below the second low battery threshold voltage.

3. The remote control of claim 1, wherein the second low battery threshold voltage is less than the first low battery threshold voltage.

4. The remote control of claim 1, wherein the transmitter transmits the low battery message with a control command.

5. A system comprising:
an entertainment device including:
an output interface that outputs a presentation stream for presentation on a presentation device; and
a wireless receiver; and
a remote control including:
a battery connector that connects to a battery powering the remote control;
a low battery detection module coupled to the battery connector that detects replacement of the battery with a replacement battery;
a transmitter coupled to the low battery detection module that, upon the low battery detection module detecting the replacement of the battery, transmits a battery replaced message to the entertainment device, wherein the entertainment device presents a menu to a user regarding the replacement of the battery;
an input module of the remote control, coupled to the low battery detection module and the transmitter, that receives a first user input indicating the type of the replacement battery powering the remote control;
the low battery detection module determining a first low battery threshold voltage for the replacement battery based on the type of the replacement battery indicated in the first user input, the first low battery threshold voltage indicating a low battery condition of the remote control;
the input, module receiving a second user input indicating a change to the output of the presentation stream by the entertainment device and generating a control command based on the second user input; and
the transmitter transmitting the control command to the receiver of the entertainment device;
the low battery detection module measuring a voltage of the replacement battery during processing of the second user input by the input module to determine whether the voltage is below the first low battery threshold voltage, the transmitter transmitting a low battery message to the receiver responsive to the low battery detection module determining that the voltage is below the first low battery threshold voltage;
the output interface of the entertainment device outputting an indicator in the presentation stream regarding the low battery condition responsive to the low battery message;
the low battery detection module determining a second low battery threshold voltage, the second low battery threshold voltage indicating when the input module is to refrain from writing to the non-volatile memory, and that determines whether the voltage of the replacement battery is below the second low battery threshold voltage; and
the input module processing the second user input without writing to the non-volatile memory responsive to the low battery detection module determining that the voltage of the replacement battery is below the second low battery threshold voltage.

6. A method of indicating a low battery condition for a remote control, the method comprising:
  determining a type of a battery powering a remote control of an entertainment device;
  selecting, based on the determined type of the battery, a first low battery threshold voltage for the battery from a plurality of low battery threshold voltages corresponding to at least two different types of batteries, the first low battery threshold voltage indicating a low battery condition of the remote control;
  determining a second low battery threshold voltage for the battery based on the determined type of the battery, the second low battery threshold voltage indicating when the remote control is to refrain from writing to a non-volatile memory;
  measuring a voltage of the battery;
  determining whether the voltage of the battery is below the first low battery threshold voltage; and
  transmitting a low battery message to the entertainment device responsive to determining that the voltage of the battery is below the first low battery threshold voltage, wherein the entertainment device utilizes the message to present an indicator to a user regarding the low battery condition of the remote control;
  receiving an input at the remote control, wherein processing of the input involves the remote control writing to the non-volatile memory;
  determining, at the remote control, whether the voltage of the battery is below the second low battery threshold voltage; and
  processing, at the remote control, the input without writing to the non-volatile memory responsive to determining that the voltage of the battery is below the second low battery threshold voltage.

7. The method of claim 6, wherein determining the type of the battery powering the remote control further comprises:
  measuring an initial voltage of the battery when the battery is placed into the remote control; and
  selecting the type of the battery from a plurality of different battery types based on the initial voltage, wherein the plurality of different battery types correspond to at least two different initial voltages.

8. The method of claim 6, wherein determining the type of the battery powering the remote control further comprises:
  providing a switch on the remote control, the switch having a plurality of positions, each position corresponding with a particular battery type and each particular battery type corresponding to one of at least two different low battery threshold voltages; and
  determining the type of the battery based on a selected one of the plurality of positions of the remote control.

9. The method of claim 6, wherein determining the type of the battery powering the remote control further comprises:
  detecting that the battery powering the remote control has been replaced;
  transmitting a battery replacement message to the entertainment device, wherein the entertainment device presents a menu to the user regarding the replacement of the battery;
  receiving user input indicating a selection of the type of the battery powering the remote control from a plurality of battery types; and
  determining the first low battery threshold voltage based on the user input, wherein the plurality of battery types correspond to at least two different low battery threshold voltages.

10. The remote control of claim 1, wherein determining the type of the battery comprises selecting, based on the initial voltage, the type of the battery from a plurality of different battery types, the plurality of different battery types corresponding to at least two different initial voltages.

11. The remote control of claim 1, wherein the first low battery threshold voltage is selected from a plurality of low battery threshold voltages corresponding to a plurality of different battery types.

12. A remote control of an entertainment device comprising:
  a battery connector that connects to a battery powering the remote control;
  a low battery detection module, coupled to the battery connector, that measures an initial voltage of the battery when the battery is connected to the battery connector and compares the initial voltage of the battery to at least one battery type threshold voltage to determine a type of the battery connected to the battery connector, that determines a first low battery threshold voltage for the battery based on the type of the battery, the first low battery threshold voltage indicating a low battery condition of the remote control, and that measures a voltage of the battery to determine whether the voltage of the battery is below the first low battery threshold voltage; and
  a transmitter coupled to the low battery detection module that transmits a low battery message to the entertainment device responsive to the low battery detection module determining that the voltage of the battery is below the first low battery threshold voltage, wherein the entertainment device utilizes the low battery message to present an indicator to a user regarding the low battery condition;
  wherein the low battery detection module is configured. to query the entertainment device for the first low battery threshold voltage based on the type of the battery.

13. A system comprising:
an entertainment device including:
  an output interface that outputs a presentation stream for presentation on a presentation device; and
  a wireless receiver; and
a remote control including:
  a battery connector that connects to a battery powering the remote control;
  a low battery detection module coupled to the battery connector that detects replacement of the battery with a replacement battery;
  a transmitter coupled to the low battery detection module that, upon the low battery detection module detecting the replacement of the battery, transmits a battery replaced message to the entertainment device, wherein the entertainment device presents a menu to a user regarding the replacement of the battery;
  an input module of the remote control, coupled to the low battery detection module and the transmitter, that receives a first user input indicating the type of the replacement battery powering the remote control;
  the low battery detection module determining a first low battery threshold voltage for the replacement battery based on the type of the replacement battery indicated in the first user input, the first low battery threshold voltage indicating a low battery condition of the remote control;
  the input module receiving a second user input indicating a change to the output of the presentation stream by the entertainment device and generating a control command based on the second user input; and the transmitter transmitting the control command to the receiver of the entertainment device;

the low battery detection module measuring a voltage of the replacement battery during processing of the second user input by the input module to determine whether the voltage is below the first low battery threshold voltage, the transmitter transmitting a low battery message to the receiver responsive to the low battery detection module determining that the voltage is below the first low battery threshold voltage;

the output interface of the entertainment device outputting an indicator in the presentation stream regarding the low battery condition responsive to the low battery message;

wherein responsive to the transmitter transmitting the battery replaced message to the entertainment device the remote control enters a user input solicitation state during which the input module is operable to receive a user input indicating the type of the replacement battery.

14. A system comprising:

an entertainment device including:
  an output interface that outputs a presentation stream for presentation on a presentation device; and
  a wireless receiver; and a remote control including:
  a battery connector that connects to a battery powering the remote control;
  a low battery detection module coupled to the battery connector that detects replacement of the battery with a replacement battery;
  a transmitter coupled to the low battery detection module that, upon the low battery detection module detecting the replacement of the battery, transmits a battery replaced message to the entertainment device, wherein the entertainment device presents a menu to a user regarding the replacement of the battery;
  an input module of the remote control, coupled to the low battery detection module and the transmitter, that receives a first user input indicating the type of the replacement battery powering the remote control:
  the low battery detection module determining a first low battery threshold voltage for the replacement battery based on the type of the replacement battery indicated in the first user input, the first low battery threshold voltage indicating a low battery condition of the remote control;
  the input module receiving a second user input indicating a change to the output of the presentation stream by the entertainment device and generating a control command based on the second user input; and
  the transmitter transmitting the control command to the receiver of the entertainment device;
  the low battery detection module measuring a voltage of the replacement battery during processing of the second user input by the input module to determine whether the voltage is below the first low battery threshold voltage, the transmitter transmitting a low battery message to the receiver responsive to the low battery detection module determining that the voltage is below the first low battery threshold voltage;

the output interface of the entertainment device outputting an indicator in the presentation stream regarding the low battery condition responsive to the low battery message, the remote control further comprising a receiver configured to receive messages from the entertainment device;

the entertainment device, upon presenting the menu to the user regarding the replacement of the battery, transmitting a message to the receiver of the remote control indicating that the menu is currently-being displayed; and the input module of the remote control configured to enter a user input solicitation state, responsive to the receiver of the remote control receiving the message, wherein the remote control is operable to receive and process a user input indicating the type of the replacement battery.

15. An apparatus comprising:

a battery connector that connects to a battery powering the apparatus;

a low battery detection module, coupled to the battery connector, that:
  measures an initial voltage of the battery when the battery is initially connected to the battery connector and compares the initial voltage of the battery to at least one battery type threshold voltage to select a type of the battery connected to the battery connector from a plurality of different battery types, the plurality of different battery types corresponding to at least two different initial voltages;
  selects a first low battery threshold voltage for the battery, based on the determined type of the battery, from a plurality of different low battery threshold voltages corresponding to at least two battery types, the first low battery threshold voltage indicating a low battery condition of the remote control; and
  measures a voltage of the battery to determine whether the voltage of the battery is below the first low battery threshold voltage; and an integrated display screen of the apparatus configured to present to a user an indication of the low battery condition responsive to the low battery detection module determining that the voltage of the battery is below the first low battery threshold voltage; and an input module that receives user input, wherein processing of the user input involves the input module writing to a non-volatile memory of the apparatus;

the low battery detection module determining a second low battery threshold voltage, the second low battery threshold voltage indicating when the input module is to refrain from writing to the non-volatile memory, and further determining whether the voltage of the battery is below the second low battery threshold voltage; and the input module refraining from writing to the non-volatile memory during processing of the user input responsive to the low battery detection module determining that the voltage of the battery is below the second low battery threshold voltage.

* * * * *